(12) United States Patent
Kim et al.

(10) Patent No.: US 12,278,322 B2
(45) Date of Patent: Apr. 15, 2025

(54) FLEXIBLE PRINTED CIRCUIT BOARD BENDING APPARATUS FOR BATTERY CELLS AND BENDING METHOD USING THE SAME

(71) Applicant: LG ENERGY SOLUTION, LTD., Seoul (KR)

(72) Inventors: Min Chan Kim, Daejeon (KR); Ju Hwan Baek, Daejeon (KR); Heung Kun Park, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 805 days.

(21) Appl. No.: 17/609,191

(22) PCT Filed: Sep. 28, 2020

(86) PCT No.: PCT/KR2020/013247
§ 371 (c)(1),
(2) Date: Nov. 5, 2021

(87) PCT Pub. No.: WO2021/096062
PCT Pub. Date: May 20, 2021

(65) Prior Publication Data
US 2022/0231319 A1 Jul. 21, 2022

(30) Foreign Application Priority Data
Nov. 13, 2019 (KR) .................. 10-2019-0144758

(51) Int. Cl.
*H01M 10/04* (2006.01)
*H05K 3/00* (2006.01)
(52) U.S. Cl.
CPC ...... *H01M 10/0404* (2013.01); *H05K 3/0014* (2013.01); *H05K 3/0044* (2013.01); *H05K 2203/302* (2013.01)

(58) Field of Classification Search
CPC .................. H01M 10/0404; H01M 10/058
See application file for complete search history.

(56) References Cited

U.S. PATENT DOCUMENTS

2005/0140100 A1* 6/2005 Peter .................. B60S 9/12
280/6.153
2020/0035982 A1* 1/2020 Choi .................. H01M 50/574

FOREIGN PATENT DOCUMENTS

CN 101945538 A 1/2011
CN 207602672 U * 7/2018
(Continued)

OTHER PUBLICATIONS

Extended European Search Report for European Application No. 20887584.9, dated Jun. 29, 2022.
(Continued)

*Primary Examiner* — Livius R. Cazan
(74) *Attorney, Agent, or Firm* — Birch, Stewart, Kolasch & Birch, LLP

(57) ABSTRACT

Discussed is a flexible printed circuit board bending apparatus for battery cells, the flexible printed circuit board bending apparatus including: a die comprising a horizontal body and a support wall configured to receive a battery cell having a flexible printed circuit board exposed outwards from one side of the battery cell; a bending guide unit located at one side of the die; and a bending unit located at the one side of the die, wherein the bending unit comprises: a stationary body; a turning body connected to the stationary body, the turning body being configured to be turnable by a predetermined first angle; and a board seating portion connected to the turning body, the board seating portion having a board seating groove formed therein, and being configured to receive the flexible printed circuit board.

19 Claims, 10 Drawing Sheets

(56) References Cited

FOREIGN PATENT DOCUMENTS

| | | | |
|---|---|---|---|
| CN | 208523058 U | 2/2019 | |
| CN | 110402505 A | 11/2019 | |
| JP | 2001-160389 A | 6/2001 | |
| KR | 10-2004-0071866 A | 8/2004 | |
| KR | 10-2007-0065078 A | 6/2007 | |
| KR | 10-2014-0137604 A | 12/2014 | |
| KR | 10-2015-0049462 A | 5/2015 | |
| KR | 10-2015-0049969 A | 5/2015 | |
| KR | 10-2015-0141810 A | 12/2015 | |
| KR | 2015141810 A * | 12/2015 | ........ H01M 10/0404 |
| KR | 10-2016-0104433 A | 9/2016 | |
| KR | 10-1659120 B1 | 9/2016 | |
| KR | 10-1713193 B1 | 3/2017 | |
| KR | 10-1758959 B1 | 7/2017 | |
| KR | 10-2018-0112323 A | 10/2018 | |
| KR | 10-2019-0035338 A | 4/2019 | |
| KR | 2019035338 A * | 4/2019 | ........ H01M 10/0404 |
| WO | WO 2019/066440 A2 | 4/2019 | |

OTHER PUBLICATIONS

International Search Report for PCT/KR2020/013247 mailed on Jan. 21, 2021.

* cited by examiner

[FIG. 1]
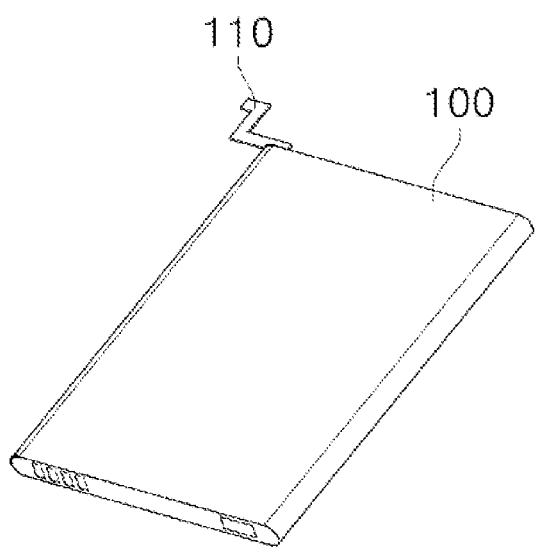

【FIG. 2】
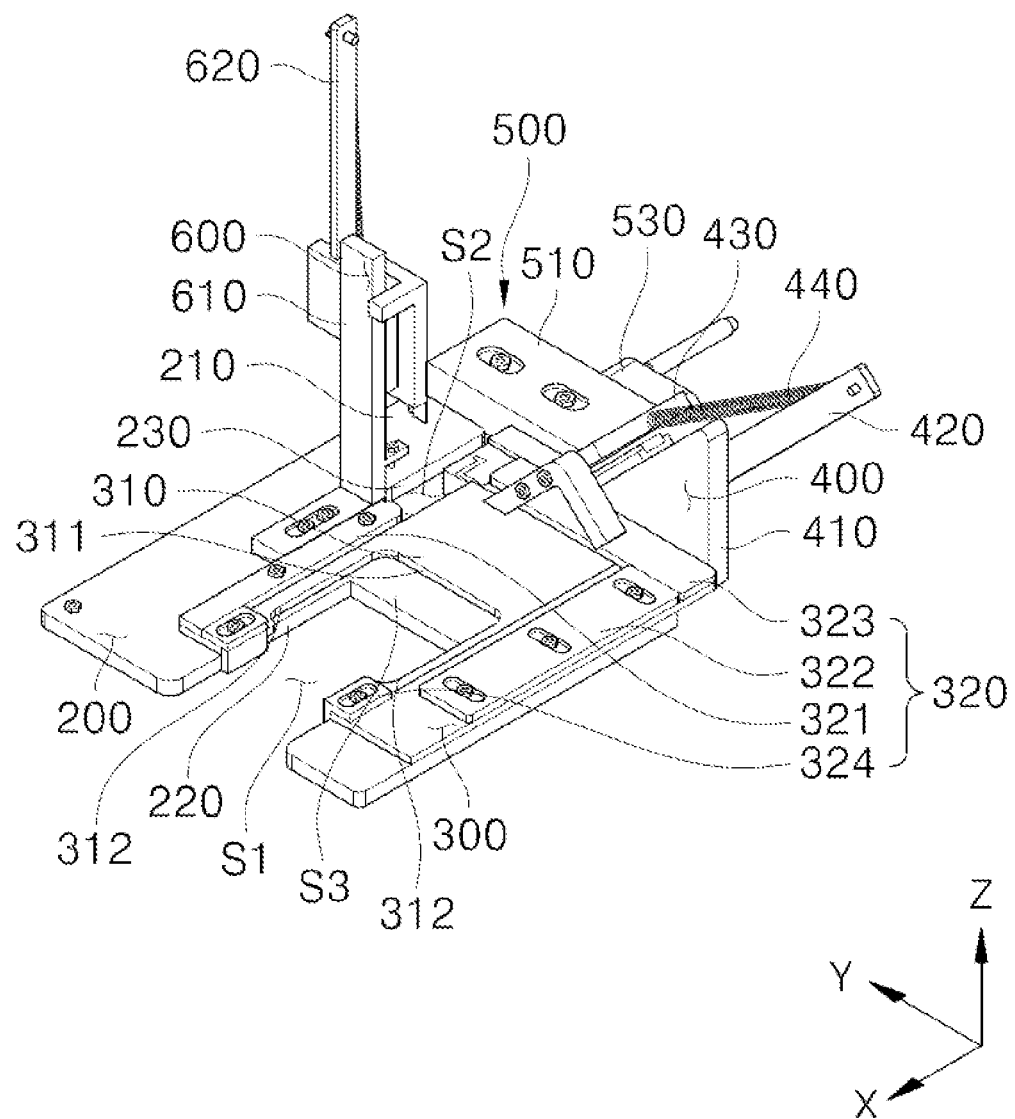

[FIG. 3]
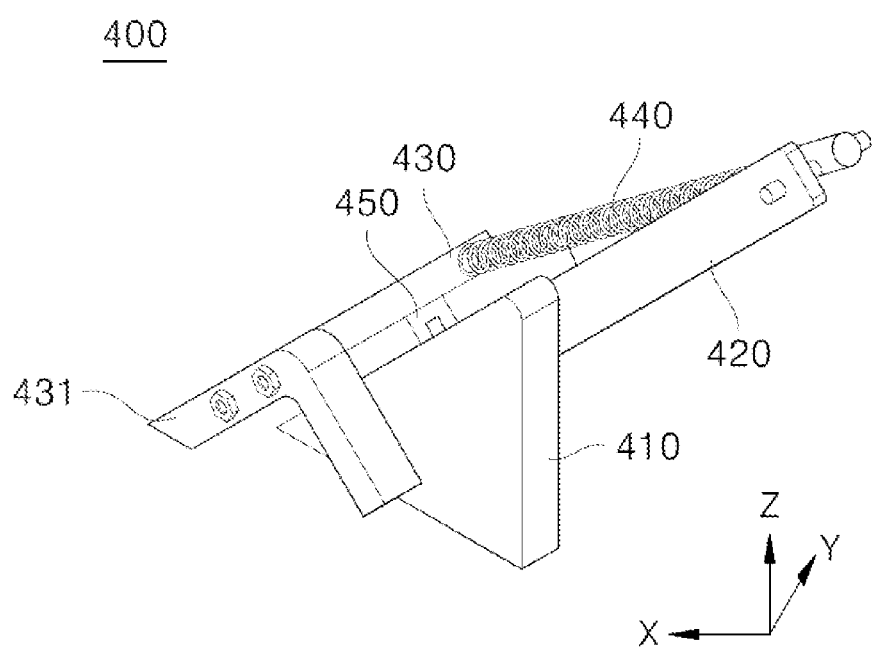

[FIG. 4]
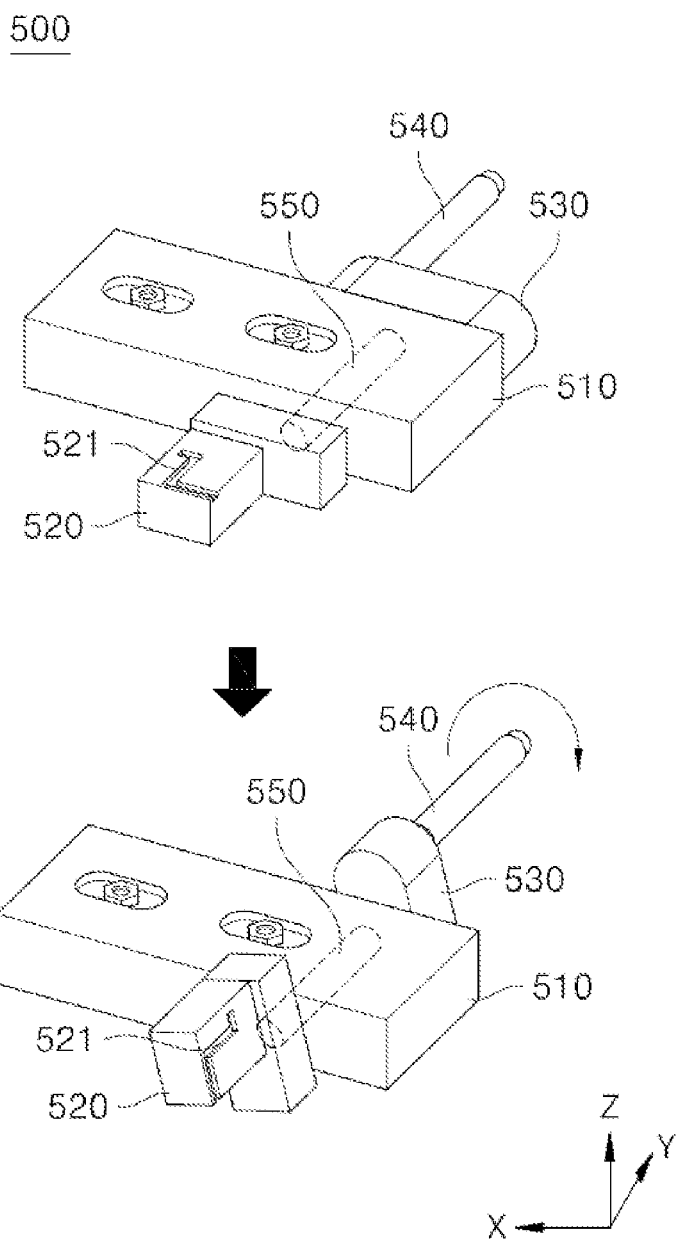

[FIG. 5]
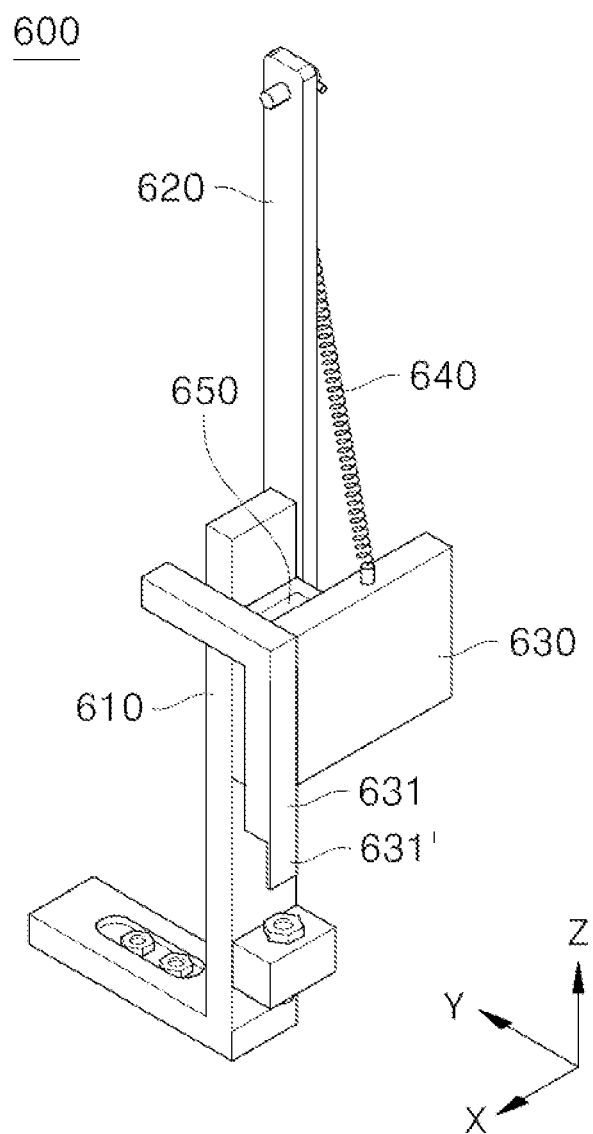

[FIG. 6]
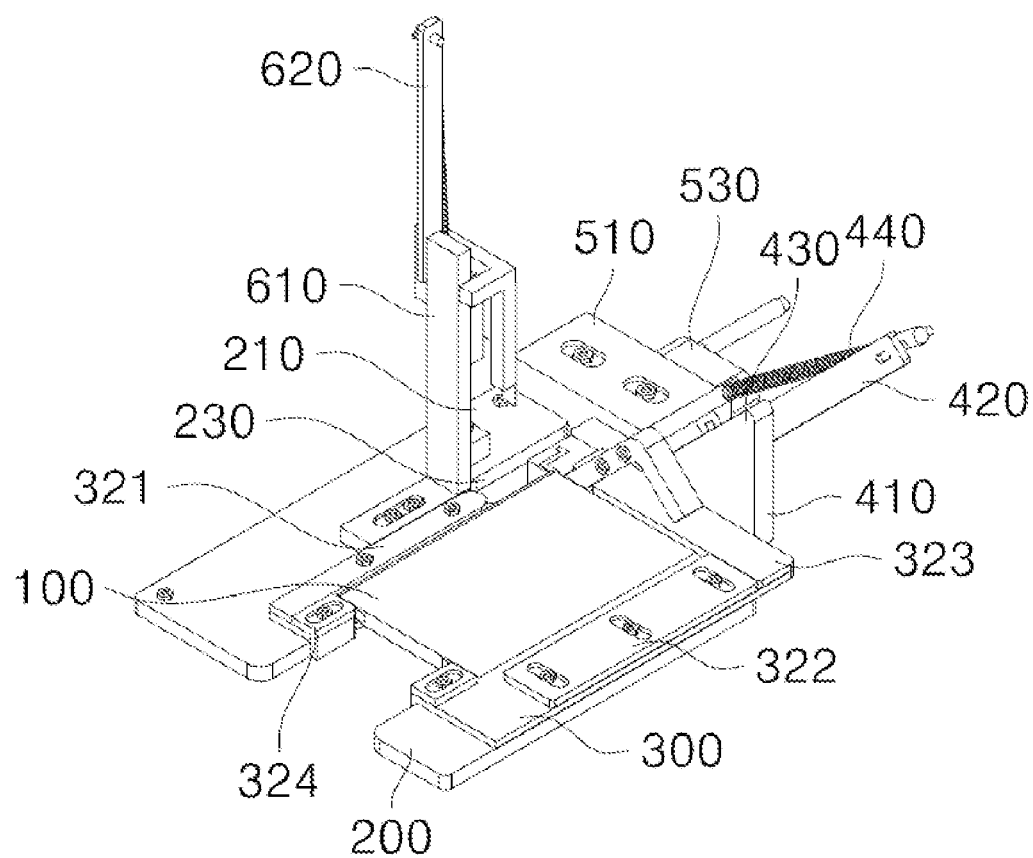

【FIG. 7】
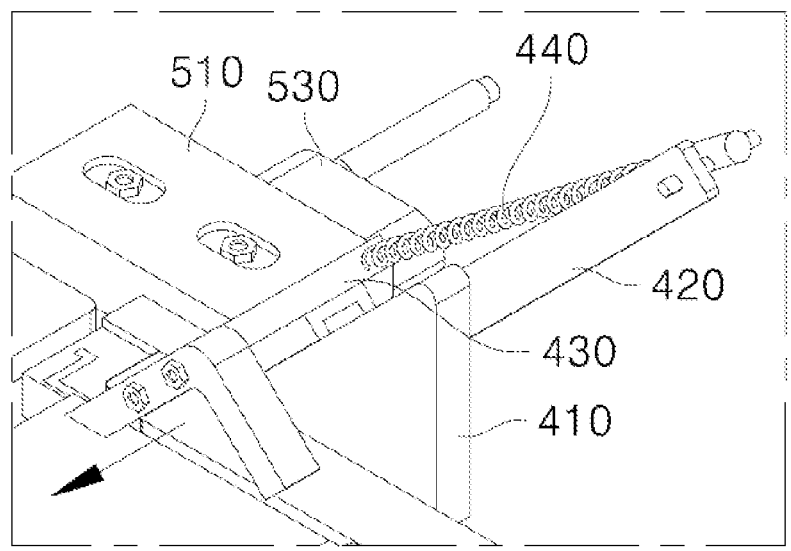
【FIG. 8】
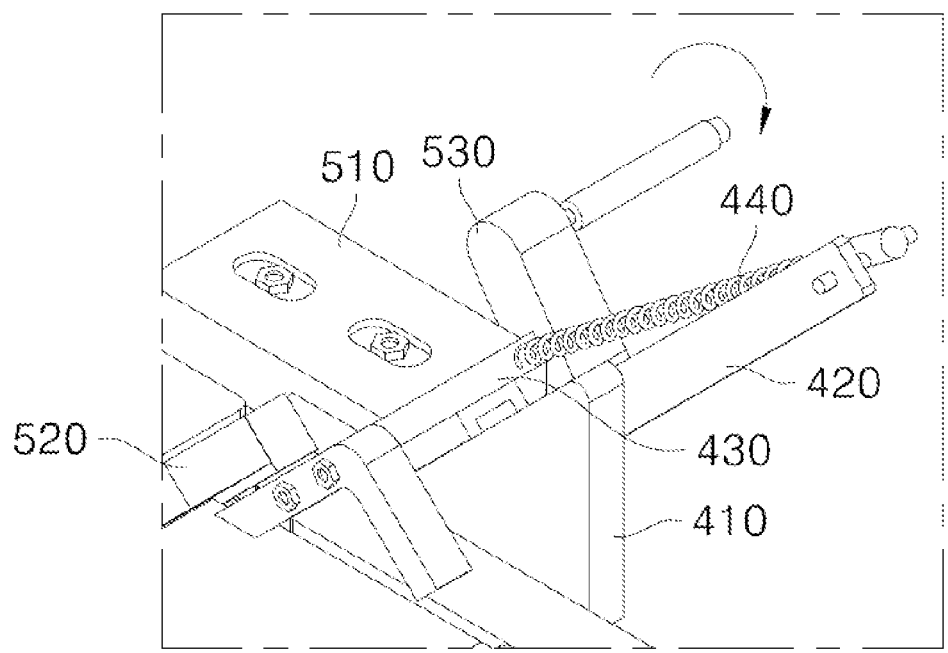

【FIG. 9】
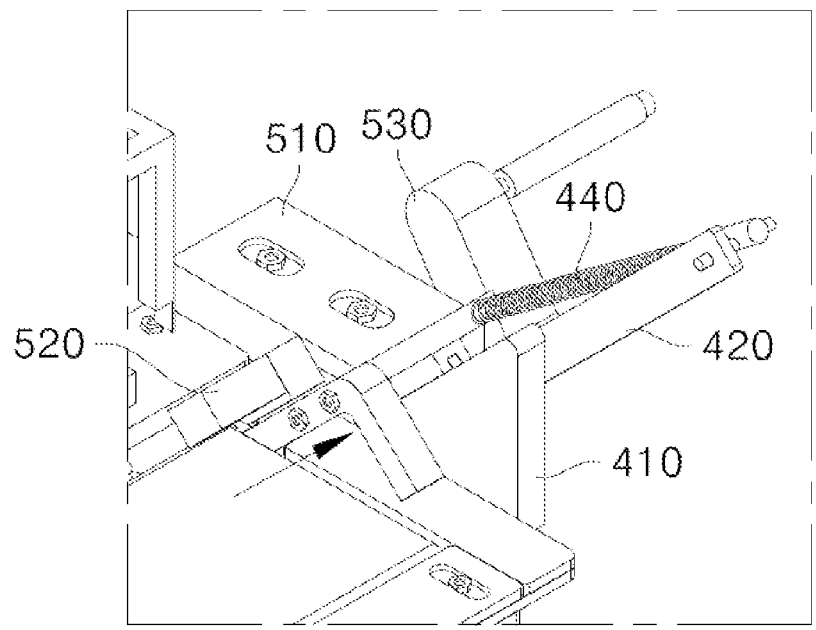
【FIG. 10】
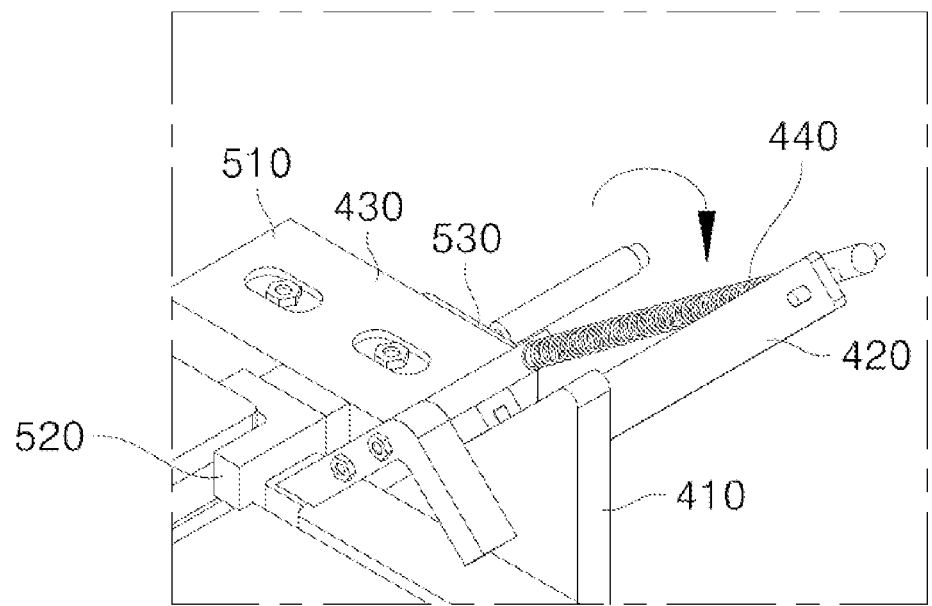

[FIG. 11]
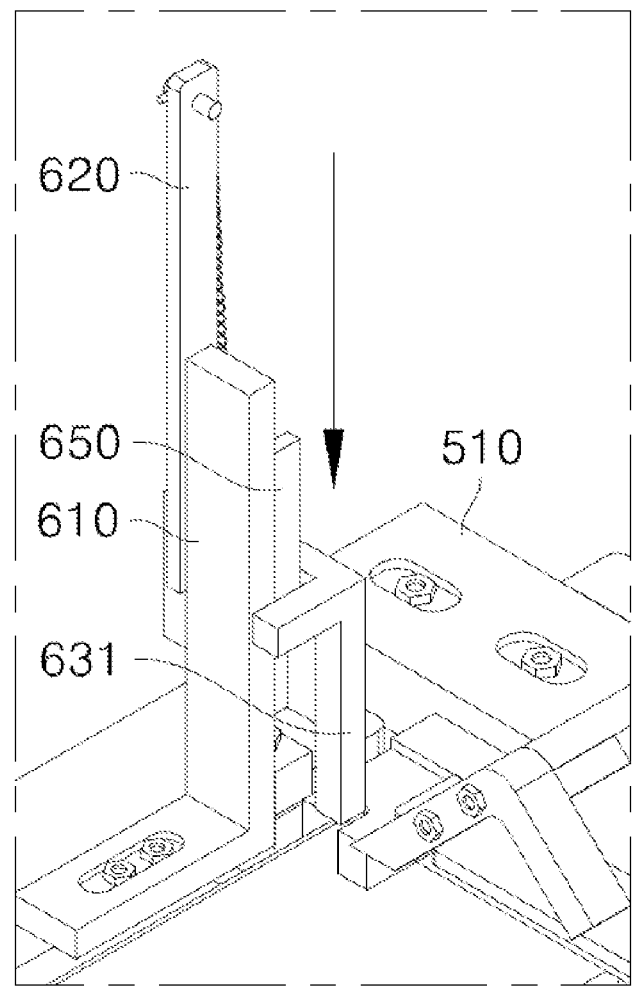

[FIG. 12]
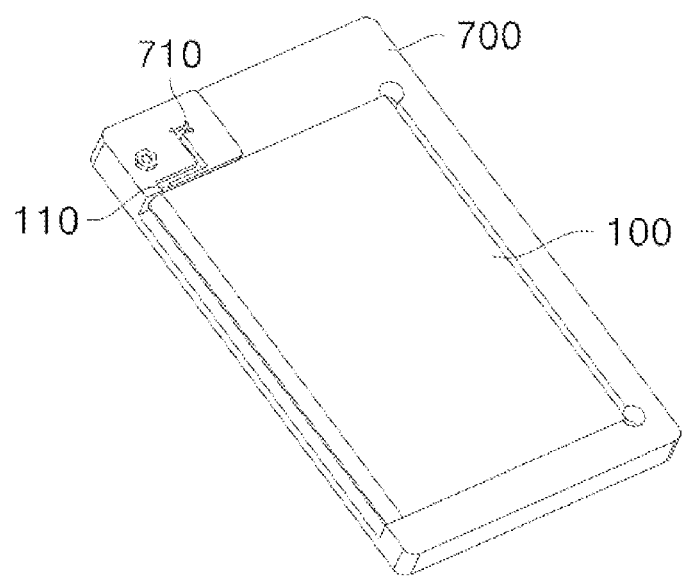

FLEXIBLE PRINTED CIRCUIT BOARD BENDING APPARATUS FOR BATTERY CELLS AND BENDING METHOD USING THE SAME

TECHNICAL FIELD

This application claims the benefit of priority to Korean Patent Application No. 2019-0144758 filed on Nov. 13, 2019, the disclosure of which is hereby incorporated by reference herein its entirety.

The present invention relates to a flexible printed circuit board bending apparatus for battery cells and a bending method using the same, and more particularly to a bending apparatus capable of accurately and rapidly bending a flexible printed circuit board of a battery cell and a bending method using the same.

BACKGROUND ART

With technological development of mobile devices, such as mobile phones, laptop computers, camcorders, and digital cameras, and an increase in the demand therefor, research on secondary batteries, which are capable of being charged and discharged, has been actively conducted. In addition, secondary batteries, which are energy sources substituting for fossil fuels causing air pollution, have been applied to an electric vehicle (EV), a hybrid electric vehicle (HEV), and a plug-in hybrid electric vehicle (P-HEV), and therefore there is an increasing necessity for development of secondary batteries.

There are a nickel-cadmium battery, a nickel-hydride battery, a nickel-zinc battery, and a lithium secondary battery as currently commercialized secondary batteries. Thereamong, the lithium secondary battery is in the spotlight, since the lithium secondary battery has little memory effect, whereby the lithium secondary battery is capable of being freely charged and discharged, has a very low self-discharge rate, and has high energy density, compared to the nickel-based secondary batteries.

Such a lithium secondary battery mainly uses a lithium-based oxide and a carbon material as a positive electrode active material and a negative electrode active material, respectively. The lithium secondary battery includes an electrode assembly, in which a positive electrode sheet having a positive electrode active material applied thereto and a negative electrode sheet having a negative electrode active material applied thereto is disposed in the state in which a separator is interposed therebetween, and a sheathing member configured to receive the electrode assembly together with an electrolytic solution in a hermetically sealed state, i.e. a battery case.

Based on the shape of a battery case, a secondary battery may be classified as a cylindrical battery having an electrode assembly mounted in a cylindrical metal can, a prismatic battery having an electrode assembly mounted in a prismatic metal can, or a pouch-shaped battery having an electrode assembly mounted in a pouch-shaped case made of an aluminum laminate sheet.

Meanwhile, FIG. 1 is a schematic view of a battery cell before a flexible printed circuit board is bent. The flexible printed circuit board (FPCB) is a circuit board including flexibly bendable metal foil (particularly, copper foil) and a flexible film formed as an outer layer. In general, the flexible printed circuit board is mounted to a battery cell so as to transmit and receive electric power and signals.

In the case in which the flexible printed circuit board (FPCB) is mounted to the battery cell, as described above, it is possible to more freely change the shape of a connection terminal, whereby it is possible to improve use and space utilization thereof. However, it is necessary to bend the flexible printed circuit board (FPCB) at various angles depending on the kind of a device and installation environments.

In connection therewith, Patent Document 1 discloses a jig apparatus for battery cells including a jig body having a seating portion in which a battery cell is seated in the state in which a printed circuit board (PCB) is exposed to the other side thereof, a fixing member provided at one side of the jig body, the fixing member being configured to fix the battery cell seated in the seating portion, and a folding member rotatably provided at the other side of the jig body, the folding member being configured to press the PCB exposed from the seating portion such that the PCB is folded so as to be located at the battery cell when being rotated.

Patent Document 1 has an advantage in that the printed circuit board (PCB) is folded, whereby it is possible to secure force of fastening between a system and a battery but has problems in that folding is limited since flexibility of the printed circuit board (PCB) is lower than that of a flexible printed circuit board (FPCB), in that space utilization is low, which is inefficient, and in that cost related to energy necessary for folding is additionally incurred.

PRIOR ART DOCUMENT (Patent Document 1) Korean Patent Application Publication No. 2015-0141810

DISCLOSURE

Technical Problem

The present invention has been made in view of the above problems, and it is an object of the present invention to provide a bending apparatus capable of accurately bending a flexible printed circuit board of a battery cell and a bending method using the same.

It is another object of the present invention to provide a bending apparatus capable of bending a flexible printed circuit board of a battery cell at low cost and a bending method using the same.

It is a further object of the present invention to provide a bending apparatus capable of securing force of fastening between a system and a battery and a bending method using the same.

Technical Solution

In order to accomplish the above object, the present invention provides a flexible printed circuit board bending apparatus for battery cells, the flexible printed circuit board bending apparatus including a die (300) including a horizontal body (310) and a support wall (320) configured to receive a battery cell (100) having a flexible printed circuit board (110) exposed outwards from one side thereof, a bending guide unit (400) located at one side of the die (300), and a bending unit (500) located at the one side of the die (300), wherein the bending unit (500) includes a stationary body (510), a turning body (530) connected to the stationary body (510), the turning body being configured to be turnable by a predetermined angle, and a board seating portion (520) connected to the turning body (530), the board seating portion having a board seating groove (521), configured to receive the flexible printed circuit board (110), formed therein.

Also, in the bending apparatus according to the present invention, the bending guide unit (400) may include a first support member (410) having one side surface inclined at a predetermined angle, a first auxiliary support member (420) fixed to one surface of the first support member (410), and a first moving portion (430) configured to be movable along the inclined surface of the first support member (410), wherein the first moving portion (430) may be provided at one side surface thereof with a first pushing portion (431) configured to support a predetermined region of the flexible printed circuit board (110).

Also, in the bending apparatus according to the present invention, the bending guide unit (400) may further include a first elastic member (440) configured to connect the first auxiliary support member (420) and the first moving portion (430) to each other.

Also, the bending apparatus according to the present invention may further include a press unit (600) located at one side of the die (300), wherein the press unit (600) may include a second support member (610), a second auxiliary support member (620) fixed to one side of the second support member (610), and a second moving portion (630) configured to be movable in a vertical direction, and the second moving portion (630) may be provided with a second pushing portion (631) configured to press a bent portion of the flexible printed circuit board (110).

Also, in the bending apparatus according to the present invention, the second pushing portion (631) is provided at one end thereof with a projecting portion (631').

Also, in the bending apparatus according to the present invention, the die (300) may be provided with a third space portion (S3) formed in a predetermined shape by incision, the third space portion being configured to allow the battery cell (100) to be easily seated and detached.

Also, in the bending apparatus according to the present invention, the die (300) may be provided at one side thereof with a second space portion (S2) formed in a predetermined shape by incision.

Also, in the bending apparatus according to the present invention, the board seating portion (520) may be located in the second space portion (S2).

Also, the bending apparatus according to the present invention may further include a support base (200) configured to space the die (300) from a floor by a predetermined height and to fix the bending guide unit (400) and the bending unit (500), wherein the support base may be located under the die (300).

Also, in the bending apparatus according to the present invention, the support base (200) may be provided with a first space portion (S1) formed in a predetermined shape by incision, the first space portion being configured to allow the battery cell (100) to be easily seated and detached.

Also, in the bending apparatus according to the present invention, the first pushing portion (431) may have a quadrangular horizontal sectional surface, the sectional surface being parallel to the flexible printed circuit board (110).

In addition, the present invention provides a bending method using the flexible printed circuit board bending apparatus for battery cells described above, the bending method including a first step of seating a battery cell (100) on the die (300), a second step of bringing one end of the first pushing portion (431) of the bending guide unit (400) into tight contact with a flexible printed circuit board (110), and a third step of turning the board seating portion (520) of the bending unit (500) by a predetermined angle so as to come into tight contact with one side surface of the first pushing portion (431).

Also, the bending method according to the present invention may further include a fourth step of moving the first pushing portion (431) of the bending guide unit (400) in tight contact with the flexible printed circuit board (110) to the original position thereof and a fifth step of turning the board seating portion (520) of the bending unit (500) by a predetermined angle so as to come into tight contact with an upper surface of the die (300).

Also, the bending method according to the present invention may further include a sixth step of moving the second pushing portion (631) of the second moving portion (630) to press a bent portion of the flexible printed circuit board (110).

Advantageous Effects

A flexible printed circuit board bending apparatus for battery cells according to the present invention includes a bending guide unit and a bending unit, whereby it is possible to perform bending at an accurate position.

In addition, the flexible printed circuit board bending apparatus for battery cells according to the present invention further includes a press unit, whereby it is possible to prevent a spring back phenomenon.

Furthermore, in the flexible printed circuit board bending apparatus for battery cells according to the present invention, bending is performed at a die configured to fix a battery cell, whereby it is possible to remarkably reduce a defect rate.

DESCRIPTION OF DRAWINGS

FIG. 1 is a schematic view of a battery cell before a flexible printed circuit board is bent.

FIG. 2 is a perspective view of a flexible printed circuit board bending apparatus for battery cells according to the present invention.

FIG. 3 is an enlarged perspective view of a bending guide unit of the bending apparatus shown in FIG. 2.

FIG. 4 is an enlarged perspective view of a bending unit of the bending apparatus shown in FIG. 2.

FIG. 5 is an enlarged perspective view of a press unit of the bending apparatus shown in FIG. 2.

FIGS. 6 to 11 are flowcharts illustrating a method of bending a flexible printed circuit board using the bending apparatus according to the present invention.

FIG. 12 is a schematic view of an inspection jig configured to check a bent battery cell.

BEST MODE

In the present application, it should be understood that the terms "comprises," "has," "includes," etc. specify the presence of stated features, numbers, steps, operations, elements, components, or combinations thereof, but do not preclude the presence or addition of one or more other features, numbers, steps, operations, elements, components, or combinations thereof.

In addition, the same reference numbers will be used throughout the drawings to refer to parts that perform similar functions or operations. In the case in which one part is said to be connected to another part in the specification, not only may the one part be directly connected to the other part, but also, the one part may be indirectly connected to the other part via a further part. In addition, that a certain element is included does not mean that other elements are excluded, but means that such elements may be further included unless mentioned otherwise.

Hereinafter, a flexible printed circuit board bending apparatus for battery cells according to the present invention will be described.

FIG. 2 is a perspective view of a flexible printed circuit board bending apparatus for battery cells according to the present invention. Referring to FIG. 2, the flexible printed circuit board bending apparatus for battery cells according to the present invention may include a support base 200, a die 300, on which a battery cell 100 is seated, a bending guide unit 400 configured to hold a bending position of a flexible printed circuit board 110, a bending unit 500 configured to rotate the flexible printed circuit board 110 to the bending position, and a press unit 600 configured to press a bent portion of the flexible printed circuit board 110.

First, the support base 200 will be described. The support base is configured to space the die 300 from a floor by a predetermined height and to fix the bending guide unit 400, the bending unit 500, and the press unit 600. The support base is located under the die 300.

When viewed from above (in a Z-axis direction), the support base is approximately quadrangular. A first space portion S1 is formed in one side of the support base by a first incision portion 220, and a protruding portion 210 is located toward a stationary body 510, a description of which will follow. A second space portion S2 is formed in the vicinity of the protruding portion 210 by a second incision portion 230.

Here, the first space portion S1 is configured to allow the hand of a worker to easily hold a battery cell 100 when the battery cell 100 is seated on the die 300 or is detached therefrom, and the second space portion S2 is configured to secure a rotation space for a board seating portion 520, a description of which will follow.

The die 300, which provides a seating space for the battery cell 100, is located along the upper part of the support base 200, more specifically the second space portion S2 of the support base 200. The die includes a flat horizontal body 310 and a support wall 320 extending upwards along the edge of the horizontal body 310 by a predetermined height, the support wall being configured to limit leftward-rightward movement of the battery cell 100 after being seated.

Meanwhile, at one side of the horizontal body 310, specifically above the first space portion S1 of the support base 200, a third space portion S3 is formed by a third incision portion 311 and a pair of fourth incision portions 312 disposed so as to face each other. The third space portion S3 is configured to easily attach and detach the battery cell 100, in the same manner as the first space portion S1 described above.

The support wall 320 may be constituted by a first support wall 321, a second support wall 322, a third support wall 323, and a fourth support wall 324 configured to support four sides of the battery cell 100.

Next, the bending guide unit will be described. FIG. 3 is an enlarged perspective view of the bending guide unit of the bending apparatus shown in FIG. 2.

The bending guide unit 400 will be described with reference to FIGS. 2 and 3. The bending guide unit 400 may include a first support member 410, a first auxiliary support member 420, a first moving portion 430, a first elastic member 440, and a first moving means 450.

The first support member 410 is formed so as to have an approximately triangular shape, one side surface of which is inclined such that the first moving portion 430 is movable in a state of being inclined at a predetermined angle. The first auxiliary support member 420 extends long in the state of being fixed to one surface of the first support member 410 by a fastening means (not shown).

The first moving portion 430 is moved along the inclined surface of the first support member 410. At this time, the first moving portion 430 may be smoothly moved by the first moving means 450 without deviating from a predetermined path.

A "┐"-shaped first pushing portion 431 is connected to one side surface of the first moving portion 430 in an inclined state. The lower end of the first pushing portion 431 has a sharp knife edge shape having an acute angle so as to be parallel to the ground in order to support a predetermined region of the flexible printed circuit board 110, a description of which will follow.

Here, the reason that the first support member 410 is inclined at the predetermined angle is that it is advantageous to work for the first moving portion 430, which is configured to push the predetermined region of the flexible printed circuit board 110, to move in the inclined state.

The first elastic member 440, which connects the first moving portion 430 and the first auxiliary support member 420 to each other, is configured to assist movement of the first moving portion 430. When force applied to the first pushing portion 431 is released, the first moving portion 430 is returned to the original position thereof by elastic force of the first elastic member 440.

Here, it is preferable that the first elastic member 440 be a spring. However, the present invention is not limited thereto as long as the first elastic member has sufficient force to return the first moving portion 430 to the original position thereof.

FIG. 4 is an enlarged perspective view of the bending unit of the bending apparatus shown in FIG. 2. The bending unit will be described with reference to FIGS. 2 and 4.

The bending unit 500, which is configured to bend the flexible printed circuit board 110 exposed from the battery cell 100, includes a stationary body 510, a board seating portion 520, a turning body 530, a handle 540, and a turning shaft 550.

The stationary body 510 serves to support the board seating portion 520, the turning body 530, the handle 540, and the turning shaft 550 such that the above components can be operated in the state of being organically connected to each other. A passage, along which the turning shaft 550 extends, is provided at a predetermined position of the stationary body.

The board seating portion 520, which is turnably coupled to the stationary body 510 in the state in which the turning shaft 550 is connected to one side thereof, is located in the second space portion S2 between the protruding portion 210 of the support base 200 and the die 300. The board seating portion 520 is provided with a board seating groove 521, which is hollowed by a predetermined depth so as to allow the flexible printed circuit board 110 connected to the battery cell 100 to be seated therein.

The turning body 530 is configured to rotate the board seating portion 520 by a predetermined angle. The other side of the turning shaft 550 is connected to one side of the turning body. In addition, the handle 540, which is configured to be held by hand, is attached to the turning body such that the turning body can be easily rotated. Of course, as previously described, the turning shaft 550 extends through the stationary body 510.

FIG. 5 is an enlarged perspective view of the press unit of the bending apparatus shown in FIG. 2. Referring to FIGS. 2 and 5 together, the press unit 600 may include a second support member 610, a second auxiliary support member 620, a second moving portion 630, a second elastic member 640, and a second moving means 650.

The second support member 610 is fixed to one side of the support base 200, and may be a vertical bar or an L-shaped bar.

The second auxiliary support member 620 extends long in the state of being fixed to one side surface of the second support member 610 by a fastening means (not shown). The second auxiliary support member 620 is located perpendicular to the ground such that the second moving portion 630 is movable in a vertical direction.

Meanwhile, the second moving means 650, which is configured to have a structure, such as a sliding structure, is located between the second support member 610 and the second moving portion 630. As a result, the second moving portion 630 is smoothly movable upwards and downwards without deviating from a predetermined path.

A "┐"-shaped second pushing portion 631 is connected to one side surface of the second moving portion 630. A "┐"-shaped projecting portion 631' is formed at the end of the second pushing portion that faces in a downward direction (the Z-axis direction). The projecting portion 631' is configured to more securely bend a bent portion of the flexible printed circuit board 110, and a more detailed description thereof will be given below.

The second elastic member 640, which connects the second moving portion 630 and the second auxiliary support member 620 to each other, is configured to assist movement of the second moving portion 630. When force applied to the second pushing portion 631 is released, the second moving portion is returned to the original position thereof by elastic force of the second elastic member 640.

Here, it is preferable that the second elastic member 640 be a spring. However, the present invention is not limited thereto as long as the second elastic member has sufficient force to return the second moving portion 630 to the original position thereof.

FIGS. 6 to 11 are flowcharts illustrating a method of bending a flexible printed circuit board using the bending apparatus according to the present invention.

A method of bending a flexible printed circuit board of a battery cell will be described with reference to FIGS. 6 to 11.

The bending method according to the present invention includes a first step of seating a battery cell 100 on the die 300, a second step of bringing one end of the first pushing portion 431 of the bending guide unit 400 into tight contact with a flexible printed circuit board 110, a third step of turning the board seating portion 520 of the bending unit 500 by a predetermined angle so as to come into tight contact with one side surface of the first pushing portion 431, a fourth step of moving the first pushing portion 431 of the bending guide unit 400, which is in tight contact with the flexible printed circuit board 110, to the original position thereof, a fifth step of turning the board seating portion 520 of the bending unit 500 by a predetermined angle so as to come into tight contact with the upper surface of the die 300, and a sixth step of moving the second pushing portion 631 of the second moving portion 630 to press a bent portion of the flexible printed circuit board 110.

First, the first step will be described in more detail with reference to FIG. 6. The first step is a step of seating the battery cell 100 on the horizontal body 310 of the die 300 and seating the flexible printed circuit board 110 in the board seating groove 521. The battery cell 100 may be easily seated due to the first space portion S1 of the support base 200 and the third space portion S3 of the die 300.

The second step will be described with reference to FIG. 7. The first moving portion 430 of the bending guide unit 400 is moved downwards in an inclined state such that the knife-edge-shaped end of the first pushing portion 431 is brought into tight contact with the flexible printed circuit board 110. This step is performed such that the flexible printed circuit board 110 is folded at a correct position thereof.

Next, FIG. 8 is a view illustrating the third step. In the third step, the handle 540 of the bending unit 500 is turned until the board seating portion 520 comes into contact with the first pushing portion 431 in the state in which the flexible printed circuit board 110 is pushed by the end of the first pushing portion 431. As a result, the flexible printed circuit board 110 is primarily folded by a predetermined angle.

FIG. 9 is a view illustrating the fourth step. The fourth step is a step of moving the first moving portion 430 of the bending guide unit 400 to the original position thereof. When force applied to the first moving portion 430 or the first pushing portion 431 is released, the first moving portion 430 is returned to the original position thereof by the first elastic member 440.

The fifth step will be described with reference to FIG. 10. The handle 540 of the bending unit 500 is further rotated until the board seating portion 520 is no longer rotated, i.e. until the flexible printed circuit board 110 is completely folded such that opposite portions thereof come into contact with each other.

FIG. 11 is a view illustrating the sixth step, which is a step of pressing a bent portion of the flexible printed circuit board 110 formed as the result of folding again to minimize a spring back phenomenon, i.e. a phenomenon in which the flexible printed circuit board returns to the original state thereof. The second pushing portion 631 of the press unit 600 is moved downwards to press the bent portion of the flexible printed circuit board 110 formed as the result of folding. At this time, the bent portion may be accurately pressed by the "┐"-shaped projecting portion 631'.

After the above step, the battery cell 100 mounted in the die 300 is withdrawn.

FIG. 12 is a schematic view of an inspection jig configured to check a bent battery cell. A battery cell 100 having a bent flexible printed circuit board 110 may be mounted in an inspection jig 700 having a flexible printed circuit board receiving groove 710 in order to check for bending defects, as shown in FIG. 12.

Although the specific details of the present invention have been described in detail, those skilled in the art will appreciate that the detailed description thereof discloses only preferred embodiments of the present invention and thus does not limit the scope of the present invention. Accordingly, those skilled in the art will appreciate that various changes and modifications are possible, without departing from the category and the technical idea of the present invention, and it will be obvious that such changes and modifications fall within the scope of the appended claims.

DESCRIPTION OF REFERENCE SYMBOLS

100: Battery cell
110: Flexible printed circuit board

200: Support base
210: Protruding portion 220: First incision portion
230: Second incision portion
300: Die
310: Horizontal body
311: Third incision portion 312: Fourth incision portion
320: Support wall
321: First support wall 322: Second support wall
323: Third support wall 324: Fourth support wall
400: Bending guide unit
410: First support member 411: First guide rail
420: First auxiliary support member
430: First moving portion 431: First pushing portion
440: First elastic member 450: First moving means
500: Bending unit
510: Stationary body
520: Board seating portion 521: Board seating groove
530: Turning body 540: Handle
550: Turning shaft
600: Press unit
610: Second support member 611: Second guide rail
620: Second auxiliary support member
630: Second moving portion
631: Second pushing portion 631': Projecting portion
632: Second fixing frame
640: Second elastic member 650: Second moving means
700: Inspection jig
710: Flexible printed circuit board receiving groove
S1: First space portion S2: Second space portion
S3: Third space portion

The invention claimed is:

1. A flexible printed circuit board bending apparatus for battery cells, the flexible printed circuit board bending apparatus comprising:
a die comprising a horizontal body and a support wall configured to receive a battery cell having a flexible printed circuit board exposed outwards from one side of the battery cell;
a bending guide unit located at one side of the die; and
a bending unit located at the one side of the die,
wherein the bending unit comprises:
a stationary body having an elongated shape with a first end and a second end that is distal to the first end;
a turning body having an elongated shape and rotatably connected to the stationary body at a location adjacent the first end, the turning body being configured to be turnable by a predetermined first angle;
a board seating portion connected to the turning body at the location adjacent the first end, the board seating portion having a board seating groove formed therein, and being configured to receive the flexible printed circuit board, and
a turning shaft extending through the stationary body at the location adjacent the first end, and having a first side connected to the turning body and a second side connected to the board seating portion.

2. The flexible printed circuit board bending apparatus according to claim 1, wherein:
the bending guide unit comprises:
a first support member having an inclined surface at a predetermined second angle;
a first auxiliary support member fixed to one surface of the first support member; and
a first moving portion configured to be movable along the inclined surface of the first support member, and the first moving portion is provided at one side surface thereof with a first pushing portion configured to support a predetermined region of the flexible printed circuit board.

3. The flexible printed circuit board bending apparatus according to claim 2, wherein the bending guide unit further comprises a first elastic member configured to connect the first auxiliary support member and the first moving portion to each other.

4. The flexible printed circuit board bending apparatus according to claim 2, wherein the first pushing portion has a quadrangular horizontal sectional surface, the quadrangular horizontal sectional surface being parallel to the flexible printed circuit board.

5. The flexible printed circuit board bending apparatus according to claim 1, further comprising:
a press unit located at one side of the die,
wherein:
the press unit comprises a second support member, a second auxiliary support member fixed to one side of the second support member, and a second moving portion configured to be movable in a vertical direction, and
the second moving portion is provided with a second pushing portion configured to press a bent portion of the flexible printed circuit board.

6. The flexible printed circuit board bending apparatus according to claim 5, wherein the second pushing portion is provided at one end thereof with a projecting portion.

7. The flexible printed circuit board bending apparatus according to claim 1, wherein the die is provided with a third space portion formed in a predetermined shape by incision, the third space portion being configured to allow the battery cell to be easily seated and detached from the die.

8. The flexible printed circuit board bending apparatus according to claim 7, wherein the die is provided at one side thereof with a second space portion formed in a predetermined shape by incision.

9. The flexible printed circuit board bending apparatus according to claim 8, wherein the board seating portion is located in the second space portion.

10. The flexible printed circuit board bending apparatus according to claim 8, wherein the second space and the third space are distanced from each other.

11. The flexible printed circuit board bending apparatus according to claim 1, further comprising:
a support base configured to support the die and to fix the bending guide unit and the bending unit,
wherein the support base is located under the die.

12. The flexible printed circuit board bending apparatus according to claim 11, wherein the support base is provided with a first space portion formed in a predetermined shape by incision, the first space portion being configured to allow the battery cell to be easily seated and detached from the support base.

13. The flexible printed circuit board bending apparatus according to claim 12, wherein the die is provided with a third space portion formed in a predetermined shape by incision, the third space portion being configured to allow the battery cell to be easily seated and detached from the die,
wherein the first space communicates with the third space.

14. The flexible printed circuit board bending apparatus according to claim 11, wherein the support base is configured to space the die from a floor by a predetermined height.

15. The flexible printed circuit board bending apparatus according to claim 1, wherein the stationary body is interposed between the turning body and the board seating portion.

16. The flexible printed circuit board bending apparatus according to claim 1, wherein a length direction of the stationary body having an elongated shape a length direction of the turning body having an elongated shape are arranged parallel prior to the turning body being turned by the predetermined first angle.

17. A flexible printed circuit board bending method for battery cells using the flexible printed circuit board bending apparatus according to claim 1, the flexible printed circuit board bending method comprising:
   seating a battery cell on the die;
      bringing one end of a first pushing portion of the bending guide unit into tight contact with the flexible printed circuit board; and
   turning the board seating portion of the bending unit by the predetermined first angle so as to come into tight contact with one side surface of the first pushing portion.

18. The flexible printed circuit board bending method according to claim 17, further comprising:
   moving the first pushing portion of the bending guide unit in tight contact with the flexible printed circuit board to an original position thereof; and
   turning the board seating portion of the bending unit by a predetermined third angle so as to come into tight contact with an upper surface of the die.

19. The flexible printed circuit board bending method according to claim 18, further comprising moving a second pushing portion of a second moving portion to press a bent portion of the flexible printed circuit board.

* * * * *